United States Patent [19]
Westwick et al.

[11] Patent Number: 5,945,878
[45] Date of Patent: Aug. 31, 1999

[54] SINGLE-ENDED TO DIFFERENTIAL CONVERTER

[75] Inventors: Alan Lee Westwick; Kevin Bruce Traylor, both of Austin, Tex.

[73] Assignee: Motorola, Inc., Schaumburg, Ill.

[21] Appl. No.: 09/024,482

[22] Filed: Feb. 17, 1998

[51] Int. Cl.[6] .................................. H03F 3/04; G06F 7/44
[52] U.S. Cl. ............................................ 330/301; 327/359
[58] Field of Search ...................................... 330/301, 275, 330/148; 455/326, 333; 327/356, 357, 359

[56] References Cited

U.S. PATENT DOCUMENTS

| | | | |
|---|---|---|---|
| 4,268,916 | 5/1981 | Kusakabe | 455/333 |
| 4,885,550 | 12/1989 | Ferrer | 330/301 |
| 5,049,831 | 9/1991 | Westwick | 330/170 |
| 5,283,484 | 2/1994 | Brehmer et al. | 307/555 |
| 5,497,123 | 3/1996 | Main et al. | 330/257 |
| 5,825,231 | 10/1998 | Chevallier et al. | 327/356 |

*Primary Examiner*—Benny Lee
*Assistant Examiner*—Patricia Nguyen
*Attorney, Agent, or Firm*—Paul J. Polansky; M. Kathryn Tsirigotis

[57] ABSTRACT

A single-ended to differential converter (400, 500) has an input terminal (418, 518) which is adapted to be coupled to an inductance (412, 512). A first transistor (402, 502) which terminates an input signal received at the input terminal according to its transconductance has a first current electrode coupled to the input terminal. A second current electrode of the first transistor (402, 502) outputs one current of a differential output current. A second transistor (404, 504) has a control electrode coupled to the input terminal, a first current electrode coupled to a signal ground terminal, and a second current electrode for providing another current of the differential output current. Bias circuits bias the control electrodes of the first (402, 502) and second (404, 504) transistors to maintain the same DC currents through their current electrodes. The single-ended to differential converter (400, 500) reflects the noise produced by the first transistor (402, 502) in the second transistor (404, 504), and this common-mode noise can be rejected in a subsequent stage.

20 Claims, 3 Drawing Sheets

SINGLE-ENDED TO DIFFERENTIAL CONVERTER

FIELD OF THE INVENTION

The present invention relates in general to electrical circuits, and in particular to single-ended to differential converters.

BACKGROUND OF THE INVENTION

Differential analog circuits have many advantages over single-ended designs that make them desirable to include in electronic systems. In particular, differential circuits have larger dynamic range, better common-mode and power supply rejection, and suppression of even-ordered distortion products. In most analog and radio frequency (RF) circuitry signals are single-ended at the board level because of the difficulty in matching components and the requirement of doubling the number of components to implement a differential circuit. Therefore, analog and RF applications typically perform a single-ended to differential conversion at the input of the system's integrated circuits.

In low-level RF applications, such as cellular phone, 2-way radios, or satellite radio receivers, the signals presented at the input of the radio receiver are very low-level signals, requiring that the single-ended to differential conversion be performed with high linearity and little noise added.

FIG. 1 shows a prior art method of performing a single-ended to differential conversion. As can be seen in FIG. 1, the RF source is input into the gate of transistor M1 and at termination resistor $R_{in}$ (typically 50 ohms), in order to match the RF source impedance, as will be appreciated by those skilled in the art. The control signal at the gate of transistor M2 is held at a fixed voltage to provide the same DC current through each of transistors M1 and M2. At lower frequencies, the input signal will vary the current through transistor M1 such that, due to the current source, an equal but opposite current is introduced into transistor M2. The converter of FIG. 1 runs into problems because the stray capacitance on the source of transistor M2 appears as a ground at RF frequencies, preventing current variations in transistor M1 from translating into current variations in transistor M2. (Especially when the capacitive impedance becomes significant with respect to the transconductance of transistor M2). In addition, the prior art converter of FIG. 1 introduces a significant amount of noise on the output. Noise is introduced from the RF source itself, from $R_{in}$, and from transistor M1 and transistor M2.

The figure of merit most often used to characterize noise in RF circuits is the noise figure (NF). The noise figure of a circuit is defined as the decrease in signal-to-noise ratio (SNR) as a signal passes through the circuit. An ideal circuit has a noise figure of unity, or 0 decibels (dB). Its output noise will be the noise of the source resistance multiplied by the circuit's gain. Thus, the addition of the termination resistor adds 3 dB of noise, and with the input signal apportioned across two transistors, both contribute additional noise. Therefore, with the substantial noise and high frequency balance problems of the prior art converter of FIG. 1, this converter has limited use at high frequencies.

FIG. 2 shows another prior art converter to a differential amplifier. The transformer attached to the inputs of the converter performs the single-ended to differential conversion and applies the differential signal to sources of transistors M1 and M2. This produces a current differential output. Although the termination resistor has been eliminated in this design, the transformer itself has introduced a signal loss that effectively lowers the SNR. Therefore, this design also has a less desirable noise figure. In addition, the transformer is typically an expensive component and will limit the operating frequency of the design such that the converter is limited to the design range of the transformer. The transformer is also physically large, consuming printed circuit board space which is decreasingly available in cellular telephone and radio applications.

FIG. 3 shows yet another single-ended to differential converter disclosed by Durec, et al. in U.S. Pat. No. 5,497,123, incorporated herein by reference. As disclosed in that patent, the advantage of the circuit of FIG. 3 is that third-order non-linearities can be canceled by appropriate selection of components and bias currents. Unfortunately, the circuit was not designed to be used in low-voltage applications and does not have an optimized noise figure. As will be appreciated, the stack of devices Q1, R1, R2, and Q3 each introduce direct current (DC) voltage loss across each device, requiring a minimum of voltage differential to be applied across those devices. Therefore, with systems operating at 5 volt power supplies, the voltage loss across these devices is insignificant, but as operating voltages are lowered to 2.7 or 1.8 volts, the circuit of FIG. 3 becomes impractical because of the voltage loss across devices. The noise figure of this converter is also not optimized. Because of the balancing of components to produce the cancellation of third-order non-linearities, Durec, et al. did not optimize the noise figure of their configuration. As will be appreciated, each of the transistors Q1, Q2, and Q3, each of the resistors R1 and R2, and the RF source each introduce noise at the outputs.

What is needed, then, is a single-ended to differential converter which has a low noise figure and which is also small and inexpensive. Such a converter is provided by the present invention, whose features and advantages will be more clearly understood from the following detailed description taken in conjunction with the accompanying drawings.

DETAILED DESCRIPTION OF THE PREFERRED EMBODIMENT

Figure 1:
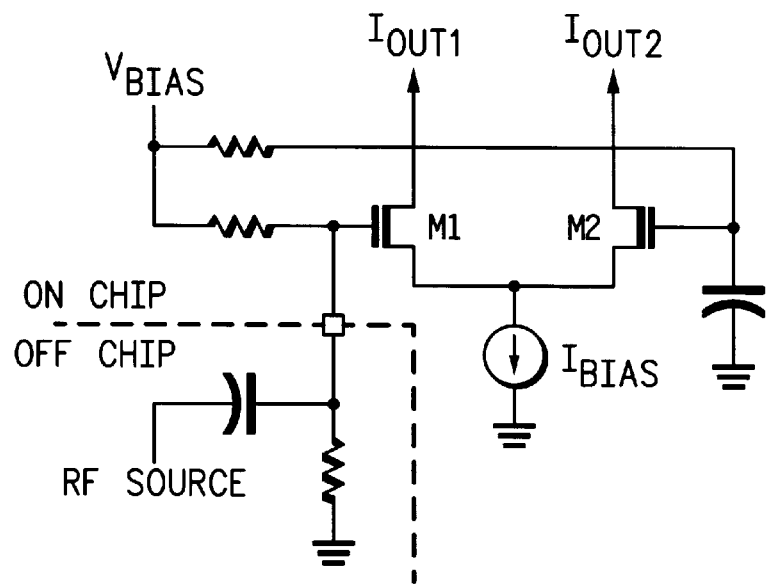
FIG. 1 illustrates in schematic form a single-ended to differential converter known in the prior art.
Figure 2:
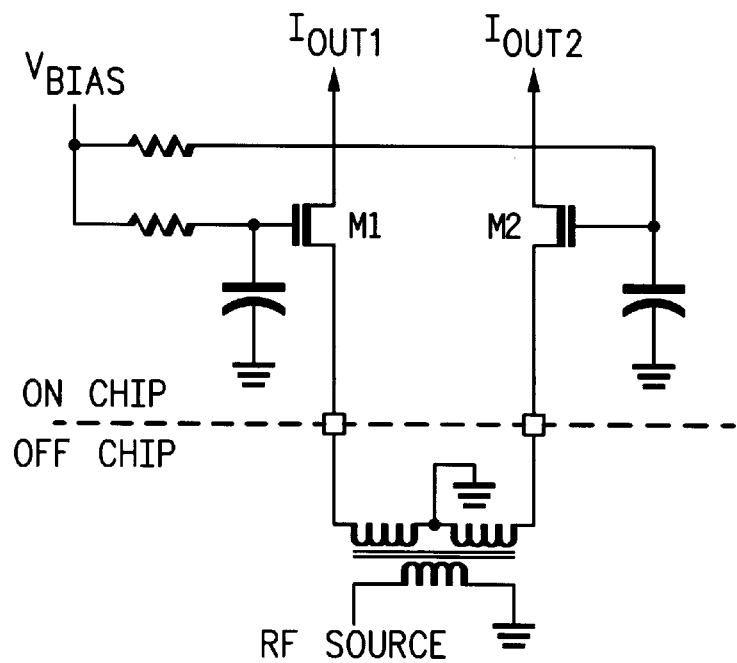
FIG. 2 illustrates in schematic form another single-ended to differential converter known in the prior art.
Figure 3:
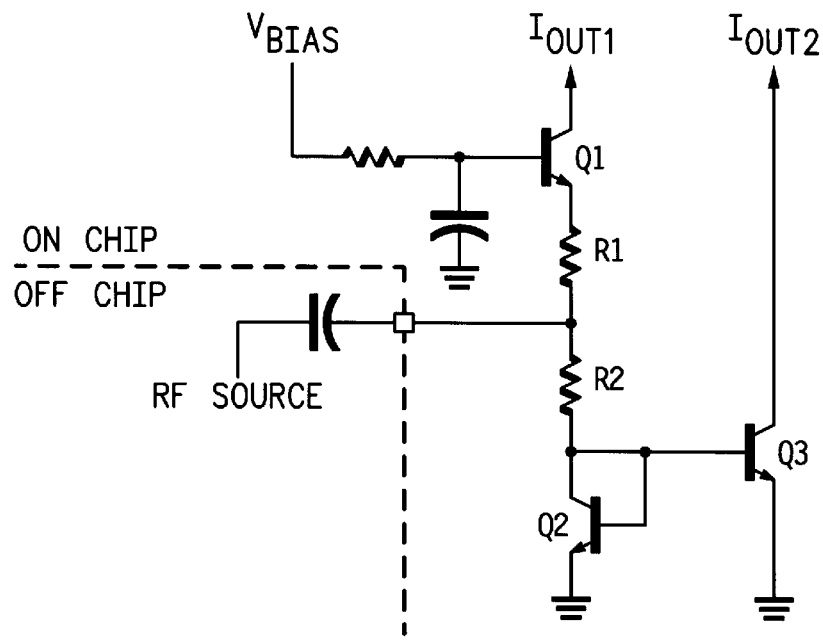
FIG. 3 illustrates in schematic form yet another single-ended to differential converter known in the prior art.
Figure 4:
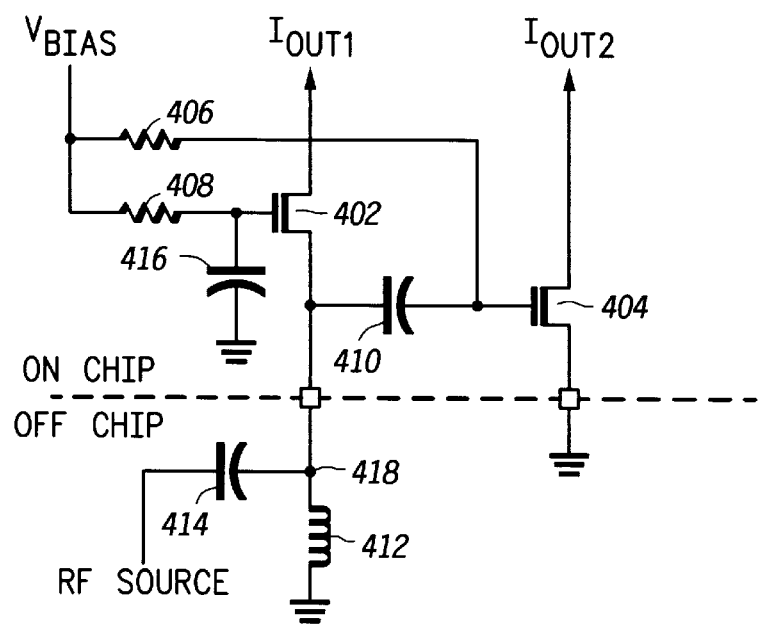
FIG. 4 illustrates in schematic form one embodiment of a single-ended to differential converter according to the present invention.

With reference now to FIG. 4, there is shown a low-noise, single-ended to differential converter which is suitable for use with differential RF amplifiers and mixers, in accordance with a preferred embodiment of the present invention. Converter 400 receives an RF signal from an RF source having a source impedance, which in the illustrated embodiment is 50 ohms, through DC blocking capacitor 414 at input terminal 418. Inductor 412 is used for DC biasing and can be considered an open circuit at RF frequencies and acts as a short-circuit at low frequencies. Converter 400 includes N-type Metal Oxide Semiconductor (NMOS) transistors 402, 404, bias resistors 406, 408, bypass capacitor 416 and coupling capacitor 410.

An important aspect of the present invention is that the input impedance of the converter 400 is set by the transimpedance (which is equal to the inverse of the transconductance, or $1/g_m$) of terminating transistor 402. Thus in the illustrated embodiment this transimpedance is set to equal the 50 ohm source resistance of the RF source at the input terminal 418. The gates of transistors 402, 404 are biased by a constant voltage ($V_{bias}$) through resistors 408, 406. Coupling capacitor 410 connects input terminal 418 to the gate of inverting transistor 404. This provides a DC-blocking from the input terminal 418, but AC-couples the input terminal 418 to allow the high frequency RF input signal to modulate the gate of transistor 404. The transimpedance of inverting transistor 404 is matched to the transimpedance of terminating transistor 402. By matching the devices, the output currents $I_{out1}$ and $I_{out2}$ will vary in a balanced, differential fashion in response to an input signal at the input terminal 418. Bypass capacitor 416 acts as an AC filter to remove noise introduced by resistor 408 at the gate of terminating transistor 402 to insure that the gate voltage of transistor 402 remains fixed.

In operation, as the RF source varies the voltage at input terminal 418, the gate-to-source voltage ($V_{gs}$) of each of terminating transistor 402 and inverting transistor 404 is varied, modulating the current outputs $I_{out1}$, $I_{out2}$. Because the output source modulates the source of terminating transistor 402 and the gate of inverting transistor 404, the current variation through each transistor varies inversely. For example, a positive excursion on the input terminal 418 will decrease the gate-to-source voltage of terminating transistor 402, reducing its current $I_{out1}$. This same excursion, however, will increase the gate-to-source voltage of inverting transistor 404 by the same amount, thereby increasing its output current $I_{out2}$ by an equal magnitude. Therefore, the converter 400 produces a single-ended to differential conversion of the input signal at the differential outputs, allowing a later stage to process $I_{out1}$ and $I_{out2}$ differentially.

In accordance with another aspect of the present invention, the converter 400 provides a substantially improved noise figure. The noise of a transistor, such as thermal and flicker noise of the MOS transistors, can be represented by a voltage source in series with the gate of the transistor. Thus, noise introduced by transistor can be represented by a voltage source at its gate ($e_2$), which introduces a current variation at $I_{out1}$ equal to the noise voltage divided by the series combination of the transimpedance of transistor 402 and the resistance of the input source. The noise voltage is divided across the transimpedance of transistor 402 and the source resistance to provide half the voltage ($e_2/2$) at the gate of transistor 404. In the preferred embodiment, this series impedance is equal to 100 ohms (50 ohms+50 ohms) and so the current variation is equal to $e_2/100$. This produces a current variation at $I_{out2}$ equal to the voltage variation at the gate of transistor 404 divided by the transimpedance of transistor 404 (i.e., $e_2/2$ divided by 50 ohms). Thus, the magnitude and polarity of the noise current introduced on the output $I_{out2}$ is equal to that of the noise current introduced on the output $I_{out1}$ by transistor 402 (i.e. $e_2/2$ divided by 50 is equal to $e_2/100$). As will be appreciated, the noise introduced by transistor 402 appears equally on each of the output currents $I_{out1}$ and $I_{out2}$ and thus is a common-mode signal. With the noise component of the transistor 402 appearing equally on each output, it can be canceled in a later stage. Therefore, transistor 402 contributes no noise to the differential output signal. The only remaining noise introduced on the differential output is the noise from the input source and the noise of transistor 404. This embodiment of the present invention produces a typical 3–5 dB of improvement in the noise figure over the prior art.

As can be seen, substantial advantages over the prior art are provided by the converter of the present invention. In particular, the converter has very low noise, since only a single transistor introduces additional noise into the noise figure. Also, the transformer is not required. Because there are no stacked devices having DC voltage drops across them, the converter of the present invention is suitable for operation in low voltage applications. Moreover, because the input signal is applied simultaneously to the inputs of both transistors, a mismatch of signal paths is not introduced.

Figure 5:
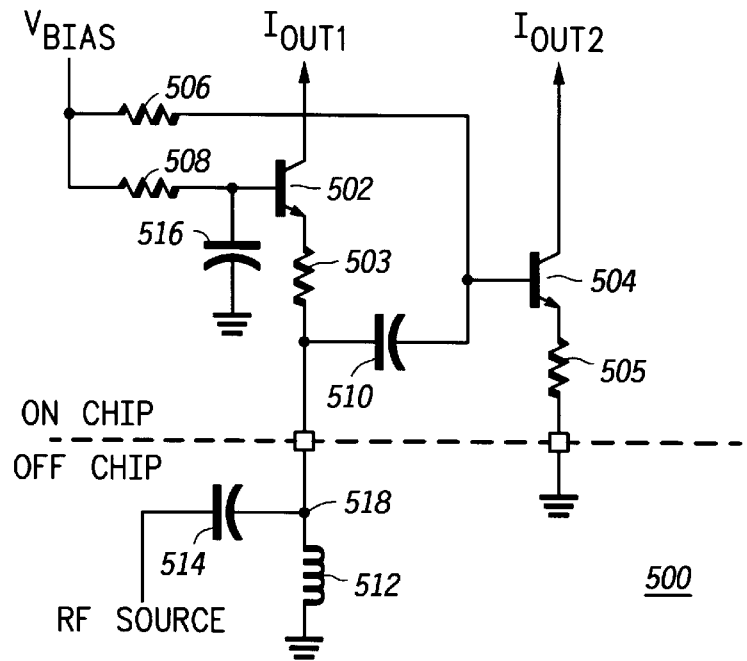
FIG. 5 illustrates in schematic form another embodiment of a single-ended to differential converter according to the present invention.

With reference now to FIG. 5, there is shown an alternative embodiment of the present invention implemented utilizing bipolar transistors. Converter 500 includes transistors 502, 504, degeneration resistors 503, 505, bias resistors 506, 508, coupling capacitor 510 and bypass capacitor 516. As will be appreciated, this circuit operates substantially similarly to the converter 400, wherein each MOS transistor has been replaced by a bipolar transistor and an emitter degeneration resistor. The transimpedance of the bipolar transistors 502, 504 are selected such that, in combination with the emitter degeneration resistors 503 and 505, the combined impedance equals the input impedance of the RF source (for example, 50 ohms). As will be appreciated, this circuit will operate substantially similarly to the MOS transistor circuit of FIG. 4 such that a single-ended input will be converted into a differential output, while the thermal noise of resistor 503 and the collector shot noise of transistor 502 introduces noise current on each of the outputs of equal magnitude and phase such that these noise components are canceled on the differential output current.

Figure 6:
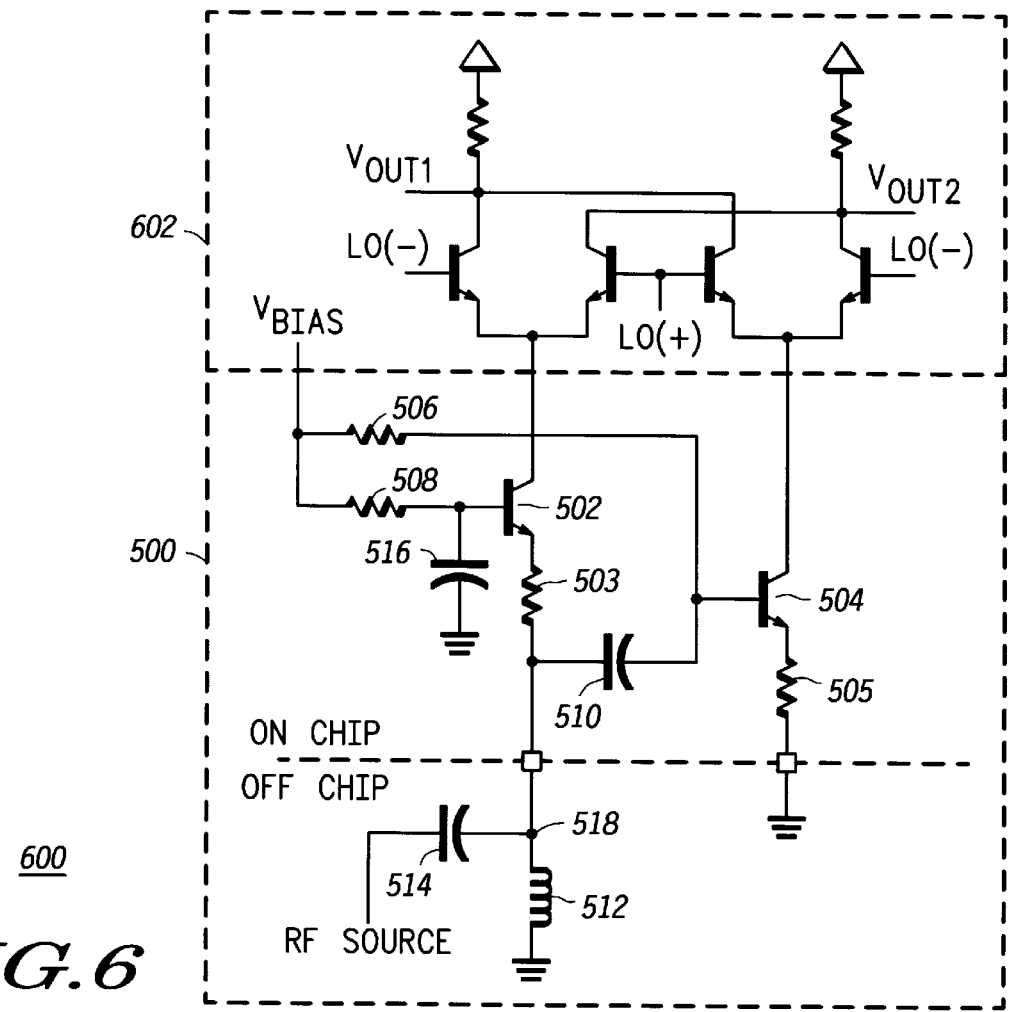
FIG. 6 illustrates in schematic form a mixer using the single-ended to differential converter of FIG. 5.

With reference now to FIG. 6, there is shown a Gilbert-type mixer implemented using the single-ended to differential converter of a preferred embodiment of the present invention. Mixer 600 includes converter 500 as shown in FIG. 5 utilized as an input into a standard Gilbert-type cell 602 to provide an improved low-noise mixer.

While the present invention has been illustrated and described with reference to specific embodiments, further modifications and improvements will occur to those skilled in the art. It will be appreciated that either MOS transistor or bipolar variations of the present invention may or may not include degeneration resistors. Also, the present invention is not only applicable to MOS and bipolar transistors, but is also applicable to other transistor technologies, including junction field effect transistors, gallium arsenide transistors, etc. Furthermore, any device having sufficient inductance to approximate an open circuit at the desired operating frequencies, such as an on-chip spiral winding inductor, an off-chip iron core inductor, or a parasitic inductance of a transmission line, may be used. It is to be understood, therefore, that this invention is not limited to the particular forms illustrated herein and that the appended claims cover all modifications that do not depart from the scope of this invention.

We claim:

1. A single-ended to differential converter comprising:
   an input terminal for receiving an input voltage and adapted to be coupled to an inductance which exists between said input terminal and a first signal ground;

a first transistor having a first current electrode coupled to the input terminal, a control electrode, and a second current electrode for providing a first current output signal;

a second transistor having a first current electrode coupled to a second signal ground, a control electrode coupled to the input terminal, and a second current electrode for providing a second current output signal, wherein said first and second current output signals form a differential current therebetween representative of an input voltage signal on the input terminal;

a first bias circuit coupled to said control electrode of said first transistor, wherein said first bias circuit biases said control electrode of said first transistor to have a predetermined transconductance; and a second bias circuit coupled to said control electrode of said second transistor, wherein said second bias circuit biases said control electrode of said second transistor to have said predetermined transconductance.

2. The single-ended to differential converter of claim 1 wherein said first bias circuit comprises:

a resistor having a first terminal for receiving a reference voltage, and a second terminal coupled to said control electrode of said first transistor.

3. The single-ended to differential converter of claim 2 wherein said first bias circuit further comprises:

a capacitor having a first terminal coupled to said control electrode of said first transistor, and a second terminal coupled to a third signal ground.

4. The single-ended to differential converter of claim 1 wherein said second bias circuit comprises:

a resistor having a first terminal for receiving a reference voltage, and a second terminal coupled to said control electrode of said second transistor.

5. The single-ended to differential converter of claim 1 further comprising:

a coupling capacitor having a first terminal coupled to the input terminal of the single-ended to differential converter, and a second terminal coupled to said control electrode of said second transistor.

6. The single-ended to differential converter of claim 1 wherein said first signal ground is equal to said second signal ground.

7. The single-ended to differential converter of claim 1 wherein said first transistor and said second transistor each comprises a field effect transistor.

8. The single-ended to differential converter of claim 1 wherein said first transistor and said second transistor each comprises a bipolar junction transistor.

9. The single-ended to differential converter of claim 1 wherein said first current electrode of said first transistor is coupled through a first impedance element to the input terminal, and wherein said first current electrode of said second transistor is coupled through a second impedance element to said second signal ground.

10. The single-ended to differential converter of claim 9 wherein each of said first and second impedance elements comprises a selected one of a resistor and an inductor.

11. The single-ended to differential converter of claim 1 further comprising a mixer having first and second input terminals coupled to said second current electrode of said first transistor and to said second current electrode of said second transistor, respectively, first and second mixing signal input terminals for respectively receiving first and second mixing signals, and first and second output terminals for providing a differential mixed signal therefrom.

12. The single-ended to differential converter of claim 1 wherein said input terminal of the single-ended to differential converter comprises an integrated circuit bonding pad.

13. A single-ended to differential converter comprising:

an inductance element having a first terminal coupled to an input terminal of the single-ended to differential converter, and a second terminal coupled to a first signal ground;

a first transistor having a first current electrode coupled to the input terminal, a control electrode, and a second current electrode for providing a first current output signal;

a second transistor having a first current electrode coupled to a second signal ground, a control electrode coupled to the input terminal, and a second current electrode for providing a second current output signal, wherein said first and second current output signals form a differential current therebetween representative of an input voltage signal on the input terminal;

a first bias circuit coupled to said control electrode of said first transistor, wherein said first bias circuit biases said control electrode of said first transistor to have a predetermined transconductance; and a second bias circuit coupled to said control electrode of said second transistor, wherein said second bias circuit biases said control electrode of said second transistor to have said predetermined transconductance.

14. The single-ended to differential converter of claim 13 wherein the single-ended to differential converter is formed as part of a single monolithic integrated circuit.

15. The single-ended to differential converter of claim 13 wherein said input terminal of the single-ended to differential converter comprises an integrated circuit bonding pad.

16. The single-ended to differential converter of claim 13 wherein said first transistor and said second transistor each comprises a field effect transistor.

17. The single-ended to differential converter of claim 13 wherein said first transistor and said second transistor each comprises a bipolar junction transistor.

18. The single-ended to differential converter of claim 13 wherein said first current electrode of said first transistor is coupled through a first impedance element to the input terminal, and wherein said first current electrode of said second transistor is coupled through a second impedance element to said second signal ground.

19. The single-ended to differential converter of claim 18 wherein each of said first and second impedance elements comprises a selected one of a resistor and an inductor.

20. The single-ended to differential converter of claim 13 further comprising a mixer having first and second input terminals coupled to said second current electrode of said first transistor and to said second current electrode of said second transistor, respectively, first and second mixing signal input terminals for respectively receiving first and second mixing signals, and first and second output terminals for providing a differential mixed signal therefrom.

* * * * *